(12) United States Patent
Fartash et al.

(10) Patent No.: US 6,472,612 B2
(45) Date of Patent: Oct. 29, 2002

(54) PRINTED CIRCUIT BOARD WITH EMBEDDED THERMOCOUPLE JUNCTIONS

(75) Inventors: Arjang Fartash, Aloha; Raiyomand Aspandiar, Portland; Tom E. Pearson, Beaverton; Christopher D. Combs, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/822,989

(22) Filed: Mar. 30, 2001

(65) Prior Publication Data

US 2002/0139575 A1 Oct. 3, 2002

(51) Int. Cl.[7] .................................................. H05K 1/16
(52) U.S. Cl. ....................................... 174/260; 361/761
(58) Field of Search ................................. 174/260, 257, 174/261, 255; 361/723, 733, 813, 761; 374/179; 439/913

(56) References Cited

U.S. PATENT DOCUMENTS 5,272,596 A * 12/1993 Honore et al. ............... 361/633
5,972,246 A * 10/1999 Nikaidoh et al. ............ 252/512

* cited by examiner

Primary Examiner—Albert W. Paladini
(74) Attorney, Agent, or Firm—Blakely, Sokoloff, Taylor & Zafman

(57) ABSTRACT

A first strip and a second strip of metal are embedded on a first layer of a printed circuit board (PCB) to form a junction. The junction has a first strip tail and a second strip tail. The first strip and the second strip are made of different metals. A first trace and a second trace are fabricated on a second layer to extend the junction to a first trace pad and a second trace pad, respectively. The first and second traces are fabricated on a second layer. The first and second traces have a first end one and a second end one, respectively. The first end one is connected to the first strip using a first via and the second end one is connected to the second strip using a second via. A first wire is inserted to the first via and a second wire to the second via to measure the temperature of the PCB.

25 Claims, 4 Drawing Sheets

PRINTED CIRCUIT BOARD WITH EMBEDDED THERMOCOUPLE JUNCTIONS

BACKGROUND

1. Field of the Invention

This invention relates to printed circuit board (PCB) design. In particular, the invention relates to thermocouple junctions embedded in the printed circuit board.

2. Description of Related Art

Thermal dissipation increases as the frequency increases since thermal dissipation is a function of the square of the frequency. Given that bus frequencies have been increasing in tandem with the processor frequencies (e.g., speeds) and with the processor frequencies doubling every 18 months, thermal management poses significant technological challenges. In order to control the temperature of the critical components mounted on the PCB, it is necessary to monitor their temperatures accurately at or near the areas in which excessive heat is generated to prevent failure of these components. The current state of the art technique for measuring the temperature utilizes externally mounted thermocouple (TC) wire junction physically attached onto or brought in contact with the surfaces of the PCB or components of interest. The other ends of these wires are typically soldered to pads or vias in the PCB. Since it is difficult or impossible to insert the thermocouple junctions directly into the area underneath the mounted components, therefore, it is not possible to measure the temperature directly and accurately using this technique. It is also important to monitor and control the temperature of the PCB during a reflow process to ensure that the components are assembled under appropriate reflow conditions.

Therefore, there is need for better structure and technique to provide a better measurement of the temperature of the components on PCB and the PCB itself.

BRIEF DESCRIPTION OF THE DRAWINGS

The features and advantages of the present invention will become apparent from the following detailed description of the present invention in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

Figure 1:
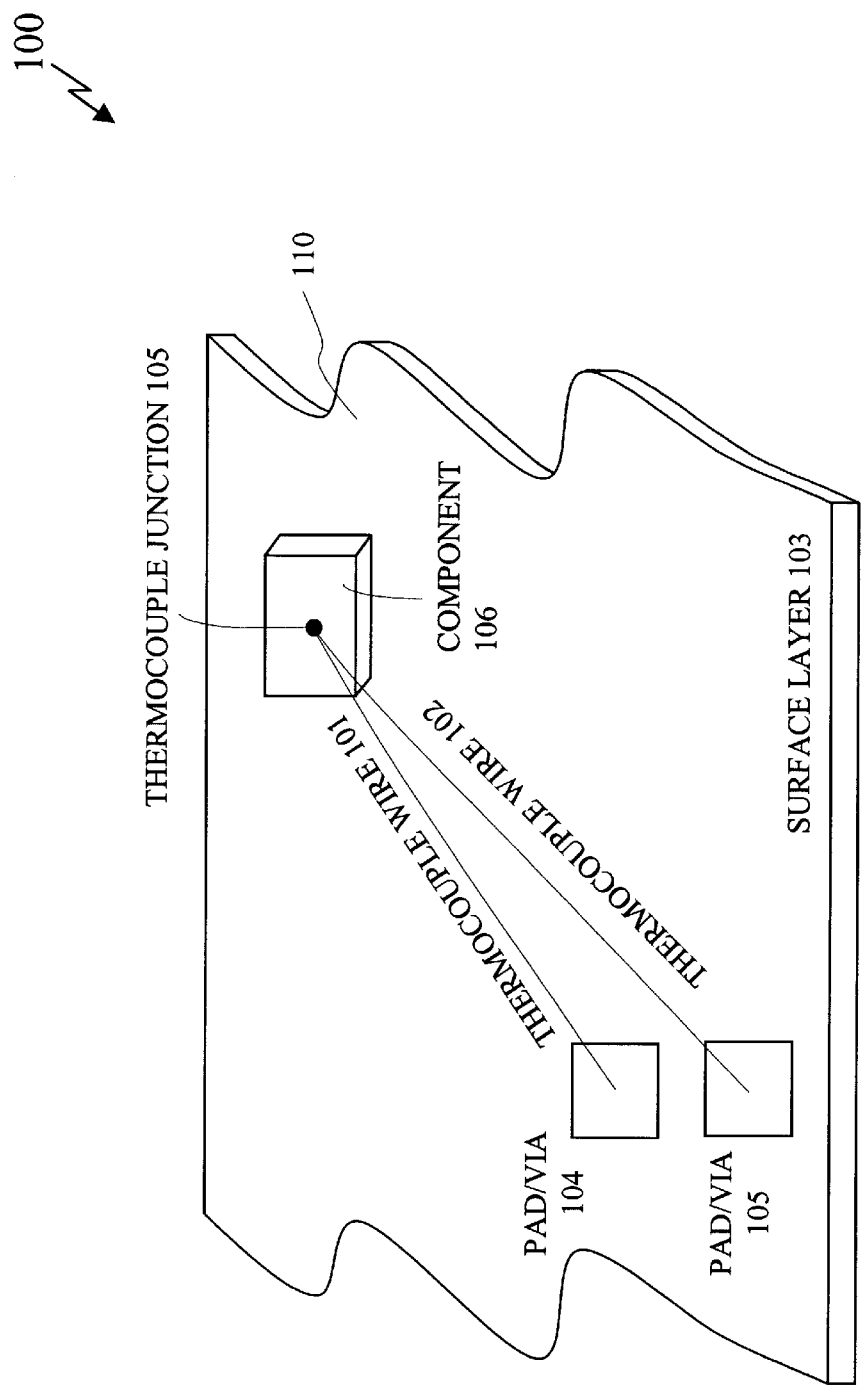
FIG. 1 is a diagram illustrating a system including a conventional thermocouple wire junction externally attached on top of a component mounted on a printed circuit board (PCB).

FIG. 1 is a diagram illustrating a system 100 including a conventional thermocouple wire junction externally attached on top of a component mounted on a printed circuit board (PCB).

The system 100 includes, among other things, a printed circuit board (PCB) 110 having a top or surface layer 103, a component 106, a thermocouple wire junction 105, thermocouple wires 101 and 102, and pads 104 and 106.

The printed circuit board 110 is used for interconnecting integrated circuit (IC) chips and other electronic components and devices. The PCB 110 is formed by substrate that supports a plurality of insulated conductive trace layers. The insulated conductive trace layers typically include surface conductive trace layers (i.e., top layer 103) and embedded trace layers with selected trace layers connected as a ground plane and a power plane. Electronic components (i.e., component 106), integrated circuits, and devices (not shown) are mounted on the surface layer 103 by plated-through holes called vias (not shown). A via is a conducting hole between the multiple layers in the PCB 110. The via may be made by drilling a via hole through the multilayer and plating the via hole with a conductive material.

The component 106 is mounted onto the surface layer 103 of the PCB 110. The component 106 dissipates heat when it is powered. The temperature of the component is measured via the thermocouple wire junction 105 attached to the surface of the component 106. The thermocouple wire junction 105 is formed by spot welding one end of the thermocouple wire 101 to one end of the thermocouple wire 102 (as shown). It is necessary that the thermocouple wires 101 and 102 be made of different materials in order to form the thermocouple junction 105. The other two ends of the thermocouple wires 101 and 102 are soldered to pads/vias 104 and 106, respectively, or directly to a multimeter or voltage sensing device. The temperature of the component 106, therefore, can be measured from the two pads/vias 104 and 106 or attaching directly to an electronic device. It is contemplated that more components and their corresponding TC wire junctions and TC wires may be mounted onto the PCB 110.

FIGS. 2A–2F are diagrams illustrating top view layouts of metal strips formed in metal foils or layers from which a thermocouple junction according to one embodiment of the invention is fabricated.

Figure 2A:
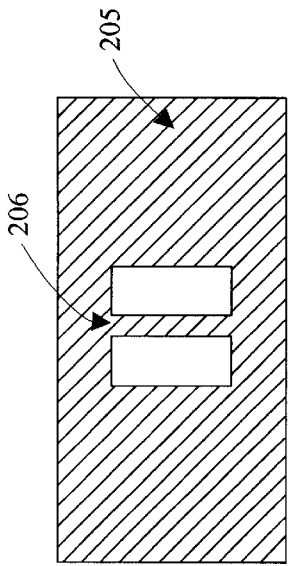
FIGS. 2A–2F are diagrams illustrating top view layouts of metal strips that formed a thermocouple junction according to one embodiment of the invention.

FIG. 2A illustrates a top view of a metal layer 201 having a metal strip 202 laid on top of a PCB layer 212 (i.e., a preimpregnated or prepeg PCB laminate). The metal layer 201 is a metal foil or layer having a thickness "d" (not shown). The foil may be copper foil, constantan foil, or any kind of metallic foil or layer amenable to forming a viable junction with another foil. In one embodiment, the metal layer 201 is made of copper foil having the thickness "d" of approximately 5 mills. The metal strip 202 is formed at a desired location by incorporating a set of two adjacent rectangular cutouts 203 and 204. The cutouts 203 and 204 are formed by removing the copper material by laser beam cutting or other standard material removal technique. The metal strip 202 has a width "w" of approximately comparable to the trace widths in the PCB. As shown in FIG. 2A, the metal strip 202 is formed in the middle of the set of cutouts 203 and 204. The set of cutouts 203 and 204 is to be used later to form a distinct thermocouple junction (will be discussed in FIG. 2E). Additional strips can be formed by making similar cutouts at different desired locations. It is contemplated that other means such as photochemical or dry etching techniques may be used in the process of removing the copper material. The cutouts and the metal strips may have any shapes and sizes and at any desired locations in relation to the metal layer 201. Also, the thickness "d" and the width "w" may vary depending on the design specification.

Figure 2C:
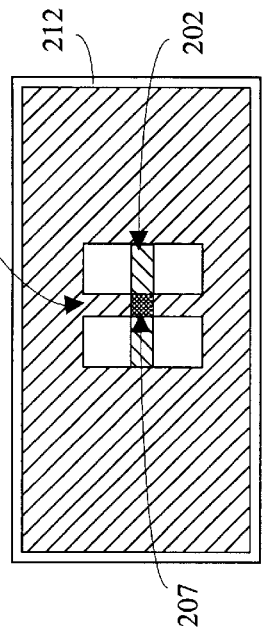
Figure 2E:
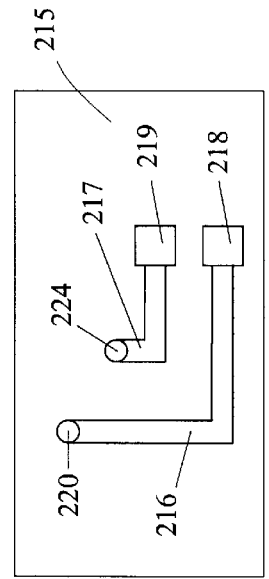
Figure 2B:
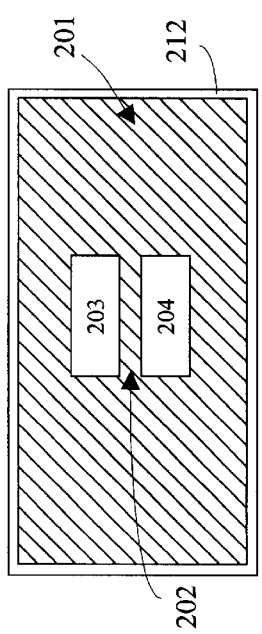

FIG. 2B illustrates a top view of a metal layer 205 having a metal strip 206. The metal layer 205 is made of different material from the metal layer 201. For example, if the metal layer 201 is made of copper then the metal layer 205 is made of material other than copper (i.e., constantan). As stated before, in order to form the thermocouple junction, it is necessary that the metal strips 206 and 202 be made of different materials. The process of making the metal strip 206 is similar to the process of making the metal strip 202. The metal strip 206 is positioned in a way that when the metal layers 205 and 201 are integrated together, a thermocouple junction is formed using the metal strips 202 and 206 (as shown in FIG. 2C).

FIG. 2C illustrates a top view of the metal layers 201 and 205 attaching together. The metal layer 205 is overlaid on the metal layer 201. In one embodiment, the overlaying strips 202 and 206 cross each other. The two strips are spot welded to form a TC junction 207 at their intersection. It is contemplated that the overlaying strips 202 and 206 may be of different shapes and or sizes and may be in contact at a different position as long as when they are spot welded the TC junction 207 having two tails made of different materials is formed.

Figure 2D:
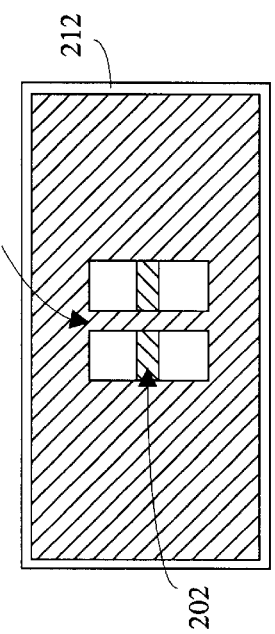

FIG. 2D illustrates a spot weld of two different material layers or foils (i.e., copper-constantan foils). By using conventional PCB manufacturing techniques, the laminate layer 212 is combined with the other laminate layers to form a multilayer PCB composite. In one embodiment, the excess copper-constantan material is removed before the process of combining the laminate layer 212 with other layers. The technique used to remove the excess material may be laser beam cutting, dry etching or wet etching (i.e., etching by chemical means). Wet etching, however, is not recommended given that the residual chemicals at the junctions of the thermocouples could pose a long-term corrosion and reliability issues. The TC junction 207 and TC tails 221 and 222 are formed after the removal of the excess materials is shown in FIG. 2E. This structure has two tails 221 and 222 that are made of copper and constantan, respectively. The TC tails 221 and 222 represent part of the strips 202 and 206, respectively.

Figure 2F:
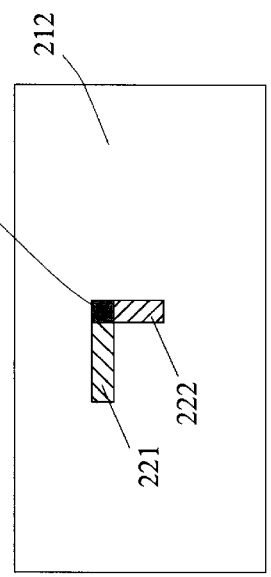

FIG. 2F illustrates a top view of a single PCB laminate layer 215 on which two metal traces 216 and 217 are etched. In one embodiment, the metal traces 216 and 217 are made of copper material. The copper traces 216 and 217 are fabricated to establish electrical contact between the TC junction 207 and the chip or module (not shown) measuring the voltage induced at the junction. The copper traces 216 and 217 are connected to pad 218 and 219 (as shown) and the other ends connect to via holes 220 and 224. These via holes extend from the layer 215 to the other layer (i.e., layer 212) in the PCB. The via holes 220 and 224 are coated with a conductive material such as copper to establish contact to other layers in the PCB.

Since the copper or constantan traces 216 and 217 and TC junction 207 are located on respective laminate layers 212 and 215, vias 220 and 224 are needed to establish electrical contact between the two layers. Vias 220 and 224 are drilled into the PCB at the ends of the traces 216 and 217 (at locations shown in FIG. 2F). These vias 220 and 224 are positioned such that drilling the vias intersects the metal traces 216 and 217 to the tails 221 and 222 of the TC junction 207. The point of contact of the vias 220 and 224 can be anywhere on the tails 221 and 222, respectively. In one embodiment, the point of contact is at the ends of the tails 221 and 222.

Figure 3:
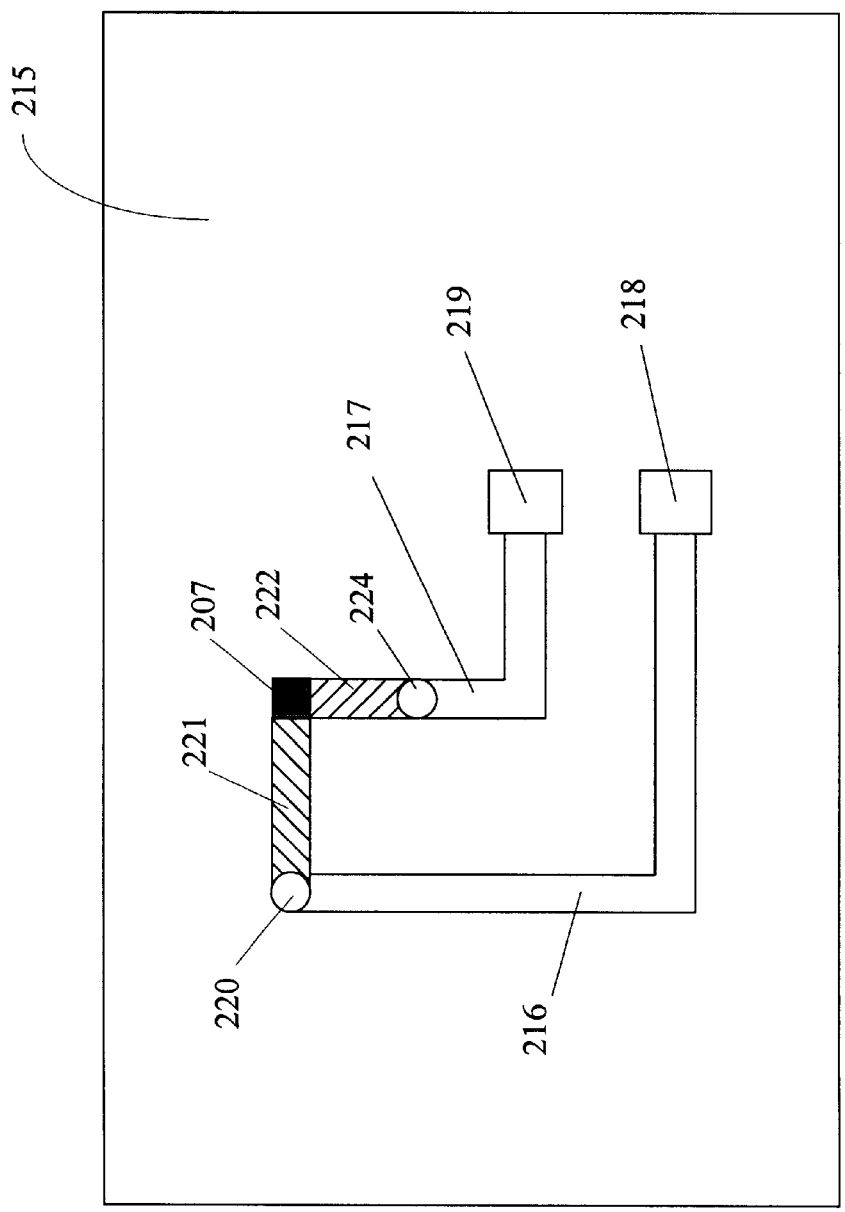
FIG. 3 is a diagram illustrating the TC junction embedded in the PCB according to one embodiment of the present invention.

FIG. 3 is a diagram illustrating the TC junction 207 and TC tails 221 and 222 embedded in the PCB according to one embodiment of the present invention.

The traces 216 and 217 are on the top layer 215 of the PCB. The traces 216 and 217 run from the vias 220 and 224 to the pads 218 and 219, respectively, on the top layer 215. The TC junction 207 and its tails 221 and 222 are shown (hatched), to indicate its location, which is buried underneath the surface layer 215. The vias 220 and 224 connect the traces 216 and 217 on the top layer 215 to the tails 221 and 222 embedded on layer 212. Voltages are measured at the pads 219 and 218. From voltage measurement, the temperature of the component on the surface layer 215 can be determined.

In another embodiment, the TC junction 207 may be used in monitoring and controlling the temperature of the PCB itself during a reflow process in which various components are surface mount assembled onto the PCB. It is important to monitor and control the temperature during the reflow process because it ensures that these components are assembled under appropriate and uniform reflow conditions. Currently, this is accomplished through positioning thermocouple wire junction directly onto the PCB surfaces prior to the reflow process. The embedded thermocouple junction 207 embedded in layer 214 allows monitoring the PCB temperature at the vias 220 and 224 of the top layer 215 without externally attaching thermocouple wires onto the PCB and circumventing the time-consuming manual work involved in attaching the TC wires.

Figure 4:
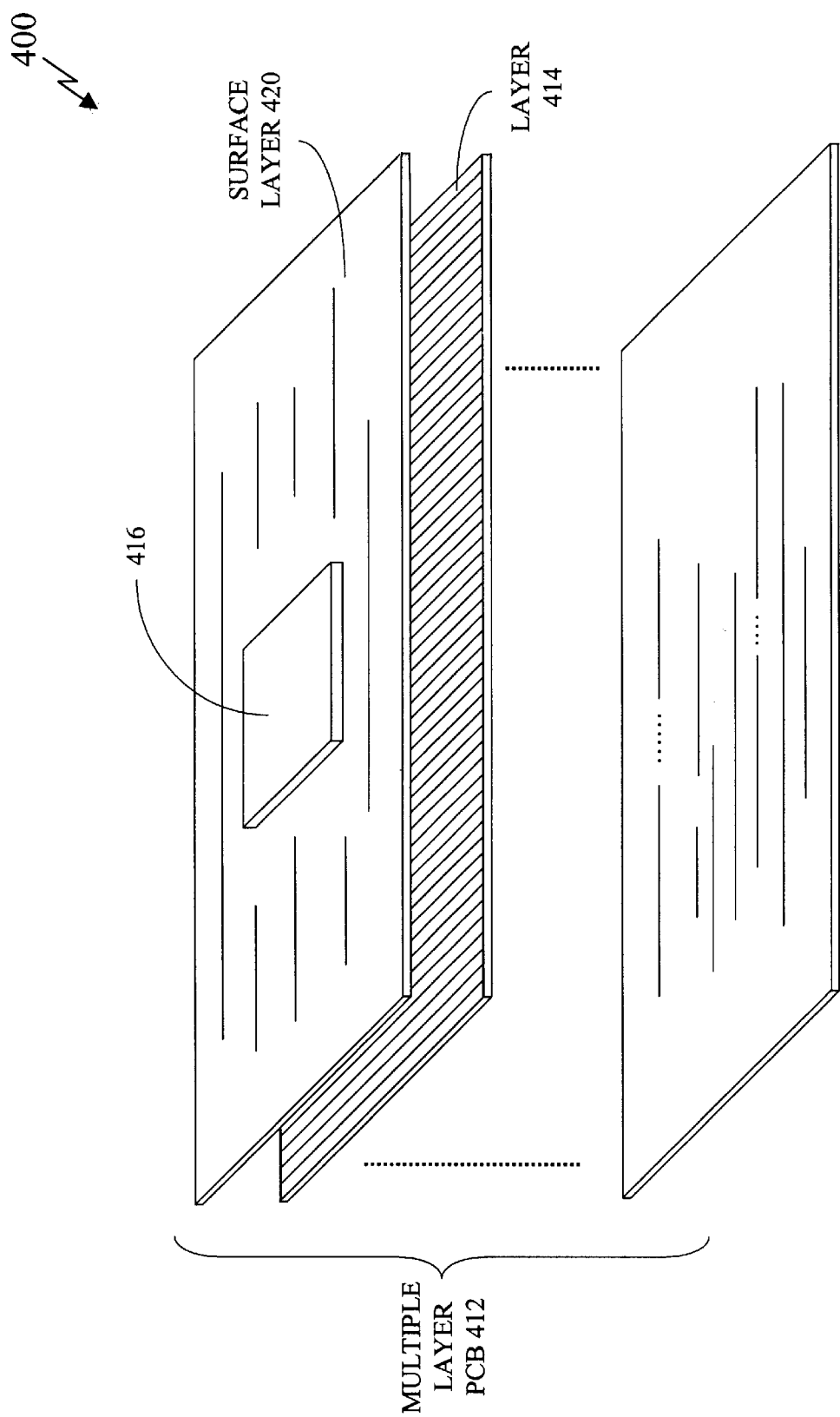
FIG. 4 is a diagram illustrating an assembly having a substrate according to one embodiment of the invention.

FIG. 4 is a diagram illustrating an assembly having a substrate according to one embodiment of the invention. The assembly 400 includes a printed circuit board (PCB) 412. This assembly 400 also includes components and devices (not shown) such as a processor die 416. The PCB 412 includes multiple layers for interconnecting integrated circuit (IC) chips and other electronic component and devices. The multiple layered PCB 412 is formed from the substrate supporting a plurality of insulted conductive trace layers. The layers typically include a surface conductive trace layer (i.e., surface layer 215) and embedded trace layers (i.e., layer 212). Integrated circuits (i.e., processor die 416) and electronic components and devices are mounted on an outer (i.e., surface) of the multiple layer PCB 412 and selectively connected to the trace layers by plated-through holes called vias.

The processor die 416 is an integrated circuit package. To have an accurate measurement of the heat dissipated from the processor die 416, a thermocouple junction (i.e., thermocouple junction 207) is embedded in layer 414 (i.e., layer 214 in FIG. 2E) one of the multiple layers in the PCB 412. In one embodiment, the thermocouple junction is embedded in the layer adjacent to the surface layer 420. The thermocouple junction is embedded underneath or nearby the processor die or integrated circuit 416 to receive a more direct and accurate temperature reading. The reading is taken at the pads/vias (i.e., pads/vias 218 and 219) on the surface layer 420.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a first strip and a second strip of metal on a first layer of a printed circuit board (PCB) to form a thermocouple junction having a first strip tail and a second strip tail, the first and second strips of metal being made of different metals; and a first trace pad and a second trace pad coupled to the thermocouple junction using a first trace and a second trace, the first and second traces on a second layer of the PCB, the thermocouple junction embedded between the first layer of the PCB and the second layer of the PCB, the first trace having a first end and the second trace having a second end, the first end being connected to the first strip tail using a first via and the second end being connected to the second strip tail using a second via, the first and second vias being used to measure a temperature of the PCB.

2. The apparatus of claim 1 wherein the first and second strips are aligned to form the thermocouple junction at a desired location in the PCB.

3. The apparatus of claim 2 wherein the thermocouple junction is a spot weld.

4. The apparatus of claim 2 wherein the first strip of metal is copper.

5. The apparatus of claim 2 wherein the second strip of metal is constantan.

6. The apparatus of claim 1 wherein the first layer is a laminate layer.

7. The apparatus of claim 1 wherein the first layer of the PCB is an embedded layer and the second layer of the PCB is a surface layer, and wherein the devic.

8. The apparatus of claim 1 wherein the first layer of the PCB is an embedded trace layer and the second layer of the PCB is a surface trace layer.

9. The apparatus of claim 1 further comprising a device disposed on the second layer of the PCB, the thermocouple junction disposed under the device to measure a temperature of the device.

10. The apparatus of claim 9 wherein the device is a processor die.

11. An assembly comprising:

a printed circuit board (PCB) having multiple layers;

a device mounted onto the PCB; and a thermocouple junction embedded in one of the multiple layers to provide accurate temperature measurement of heat dissipated from the device, the thermocouple junction comprising:

a first strip and a second strip of metal on a first layer of the PCB to form a junction having a first strip tail and a second strip tail, the first and second strips of metal being made of different metals, a first trace pad and a second trace pad coupled to the thermocouple junction using a first trace and a second trace, the first and second traces being fabricated on a second layer of the PCB, the first trace having a first end and the second trace having a second end, the first end being connected to the first strip tail using a first via and the second end being connected to the second strip tail using a second via, and a first wire inserted in the first via and a second wire inserted in the second via to measure a temperature of the PCB.

12. The assembly of claim 11 wherein the thermocouple junction is a spot weld.

13. The assembly of claim 12 wherein the first and second strips are aligned to form the thermocouple junction at the desired location in the PCB.

14. The assembly of claim 12 wherein the first strip of metal is copper.

15. The assembly of claim 12 wherein the second strip of metal is constantan.

16. The assembly of claim 11 wherein the first layer is a laminate layer.

17. The assembly of claim 11 wherein the first layer of the PCB is an embedded layer and the second layer of the PCB is a surface layer.

18. The assembly of claim 11 wherein the first layer of the PCB is an embedded trace layer and the second layer is a surface trace layer.

19. The apparatus of claim 11 wherein the device is a processor die.

20. An assembly comprising:

a printed circuit board (PCB) having multiple layers;

a device mounted onto the PCB; and a thermocouple junction embedded in one of the multiple layers to provide accurate temperature measurement of heat dissipated from the device, the thermocouple junction comprising:

a first strip and a second strip of metal on a first layer of the PCB to form a junction having a first strip tail and a second strip tail, the first and second strips of metal being made of different metals, and a first trace pad and a second trace pad coupled to the thermocouple junction using a first trace and a second trace, the first and second traces being fabricated on a second layer of the PCB, the first trace having a first end and the second trace having a second end, the first end being connected to the first strip tail using a first via and the second end being connected to the second strip tail using a second via.

21. The assembly of claim 20 wherein the thermocouple junction is a spot weld.

22. The assembly of claim 20 wherein the first and second strips are aligned to form the thermocouple junction at the desired location in the PCB.

23. The assembly of claim 20 wherein the first layer of PCB is a laminate layer.

24. The assembly of claim 20 herein the first strip of metal is copper.

25. The assembly of claim 20 wherein the second strip of metal is constantan.

* * * * *